United States Patent [19]

Trotter et al.

[11] 4,222,062
[45] Sep. 9, 1980

[54] VMOS FLOATING GATE MEMORY DEVICE

[75] Inventors: James D. Trotter, Saratoga; Thurman J. Rodgers, Menlo Park, both of Calif.

[73] Assignee: American Microsystems, Inc., Santa Clara, Calif.

[21] Appl. No.: 683,185

[22] Filed: May 4, 1976

[51] Int. Cl.$^2$ .................. H01L 27/10; G11C 11/40
[52] U.S. Cl. .................. 357/45; 357/23; 357/55; 357/59; 357/60; 357/71; 365/185
[58] Field of Search .................. 357/23, 41, 54, 60, 357/59, 45; 365/184, 185

[56] References Cited

U.S. PATENT DOCUMENTS

| | | | |
|---|---|---|---|
| 3,825,945 | 7/1974 | Masuoka | 357/54 |
| 3,975,221 | 8/1976 | Rogers | 357/54 |
| 3,992,701 | 11/1976 | Abbas et al. | 357/23 |

OTHER PUBLICATIONS

Rogers et al., "VMOS: . . . ", IEEE J. of Solid-State Circuits, vol. SC9, No. 5, Oct. 1974, pp. 247-249.

*Primary Examiner*—William D. Larkins
*Attorney, Agent, or Firm*—Owen, Wickersham & Erickson

[57] ABSTRACT

A semiconductor programmable read only memory device (PROM) utilizes an array of memory cells each having an area basically defined by the intersection of a bit line and a word address line. On a substrate of one conductivity type is an upper layer of material of the opposite conductivity within which are diffused bit lines of the same conductivity material as the substrate. The crossing address lines are conductive material formed on an insulating layer that covers the diffused bit lines and the upper layer. Each cell is a single transistor element in the form of a V-type MOSFET which achieves the normal AND function (Data-Word Address) using a capacitance coupled version of threshold logic. Each MOSFET is formed by a V-shaped recess at the intersection of each bit line and address line that extends through the diffused bit line, (which serves as the transistor drain) and into the substrate (which serves as the source and ground plane of the device). A similarly V-shaped floating gate is isolated below and above the crossing bit and address lines by thin oxide layers. Data is written into the cell when hot electrons are injected into the gate oxide near the drain junction and attracted to the floating gate which has been charged positive by capacitance coupling from the word line. The hot electrons are generated from the channel current via impact ionization at the pinched-off drain junction.

2 Claims, 14 Drawing Figures

FIG_1

FIG_2

FIG_3

FIG_4

FIG_5

FIG_6

FIG_7

FIG_8

FIG_9

FIG_10

FIG_11

FIG_12

FIG_13

FIG_14

VMOS FLOATING GATE MEMORY DEVICE

BACKGROUND OF THE INVENTION

This invention relates to a programmable read only memory device (PROM) and more particularly to an integrated circuit semiconductor PROM comprised of an array of closely packed memory cells each utilizing a single transistor element.

Semiconductor read only memory (ROM) devices which are permanently programmed during fabrication are well known. Fusing techniques after fabrication wherein an electrical pulse is used to permanently and irreversably destroy selected interconnection lines to provide the desired programming of a device have also been widely used. The advantages including increased versatility of a ROM that is reprogrammable after fabrication are readily apparent. Previous attempts to provide such a programmable ROM device included the use of charge storage in a portion of the gate dielectric of one or more MOSFET's (metal-oxide-silicon-field effect transistor) which comprised the memory cell. Here, memory storage was achieved by electron injection and trapping in regions of sandwiched gate dielectrics by suitably applied gate voltages. Non-destructive reprogramming was accomplished by changing polarity of the gate voltage on preselected cells of the device. A further development in the field of reprogrammable ROM devices involved the so-called floating gate avalanche injection MOS (FAMOS) structure. Examples of such devices may be found in U.S. Pat. Nos. 3,660,819 and 3,755,721. Here, a memory cell was programmed by charge transport to the floating gate by avalanche injection of electrons from source-substrate or drain-substrate junctions. However, the FAMOS devices heretofore devised or proposed require that each cell have essentially a planar layout on the semiconductor chip wherein the floating gate region was essentially parallel to the surface of the device itself and extended over spaced apart diffused regions in the conventional manner. This arrangement required a substantial amount of chip area for each PROM cell, and since such PROM devices normally utilize a large number of cells, the overall area of such prior devices was considerable. The present invention provides a solution to this problem by providing a reprogrammable ROM or PROM wherein the area required for each memory cell is much lower than heretofore required for such devices.

SUMMARY OF THE INVENTION

In broad terms, the present invention provides a reprogrammable read-only semiconductor memory device which comprises an array of single transistor memory cells formed at the crossover locations of word address lines and bit lines. In one embodiment of the invention, the memory device is formed on a silicon substrate with an N-type conductivity having an epitaxial P layer on the substrate. The bit lines are elongated diffused N-type regions within the P layer that are parallel and spaced apart in one direction across the device. The P layer and N-type bit lines are covered by an insulation layer of oxide and a series of parallel, spaced apart word-address lines of some suitable conductive material such as polycrystalline silicon are formed on top of the oxide layer at right angles to the diffused bit lines. At each point on the device where a word line crosses over a bit line, a memory cell is formed within a recess that extends through the diffused N-type bit line and into the similar N-type substrate material. The recess has a "V" or inverse square pyramidal shape and is formed by an anisotropic etchant. The use of such etchants in the fabrication of so-called V-groove type semiconductor devices is disclosed in U.S. Pat. No. 3,924,265, which is assigned to the assignee of this application. Formed within the recess is a floating gate of polycrystalline silicon material which has the same V or pyramidal shape as the recess. This gate is separated on its bottom side from the N-type diffused bit line material by a thin layer of gate oxide. On its top side, the floating gate is separated from the conductive address line by a similar thin insulative layer such as silicon oxide or a combination of silicon oxide and silicon nitride. In the aforesaid structure for each cell the N-type material near the floating gate becomes the drain of an active V-type MOSFET device and the N-type substrate material adjacent the lower tip of the floating gate becomes the source of the MOSFET device.

Data is written into the cell by injecting electrons into the gate oxide near the drain junction and attracting the electrons to the floating gate which has been charged positive by capacitance coupling from the word line. The electrons must be sufficiently energetic (commonly referred to as "hot electrons") to overcome the potential barrier of the gate oxide. A preselected fixed potential applied to the word line is assumed to couple a portion of that voltage into the floating gate which is sufficient to attract the programming charge from the avalanching bit line. Thus, a net voltage shift occurs on the floating gate. Without a selection of the word line, i.e. word line remains at zero potential, the floating gate remains at zero potential and therefore will not attract the charges. After injecting the negative charge on the floating gate, the word line is returned to zero potential and the floating gate returns to some negative potential, depending on the quantity of electrons collected. During the read cycle, operation at a lower fixed voltage on the word line induces a small voltage shift on the floating gate. Assuming the gate was charged sufficiently negative during programming, the memory cell transistor will remain non-conductive (its threshold voltage higher than the floating gate voltage) and the output will remain at the power supply voltage ($V_{DD}$). If the floating gate was not charged negative, it will be shifted by the addressed word line to a voltage which is sufficient to turn-on the transistor.

A PROM device providing the aforesaid operation may be fabricated by a method in accordance with the invention which incorporates some of the known principles of VMOS IGFET devices as set forth in U.S. Pat. No. 3,924,265, which is assigned to the assignee of the present invention. The method steps of the present invention include the formation of two separate layers of polycrystalline silicon, one of which is used to form inverted pyramidal shaped floating gates for each memory cell and another of which is used to form conductive word lines, bit line contacts and gates for peripheral logic transistors used in circuitry required outside of the memory core. Further the method provides for fabrication of memory device having a high density per unit area of memory cells wherein the formation of all elements of the device is accomplished by a minimum of steps.

In summary, a general object of the present invention is to provide an improved reprogrammable read-only memory (PROM) device.

Another object of the present invention is to provide a semiconductor PROM wherein each memory cell utilizes a chip area substantially equal to the cross over area of a bit line and a word address line.

Another object of the present invention is to provide a semiconductor PROM wherein each memory cell of the device utilizes a single active element which is a V-type MOSFET.

Another object of the present invention is to provide a semiconductor PROM which has a particularly fast access time.

Still another object is to provide an effective and reliable method for fabricating semiconductor PROM devices.

Other objects, advantages and features of the present invention shall become apparent from the following detailed description, presented with the accompanying drawing.

DETAILED DESCRIPTION OF PREFERRED EMBODIMENT

Figure 1:
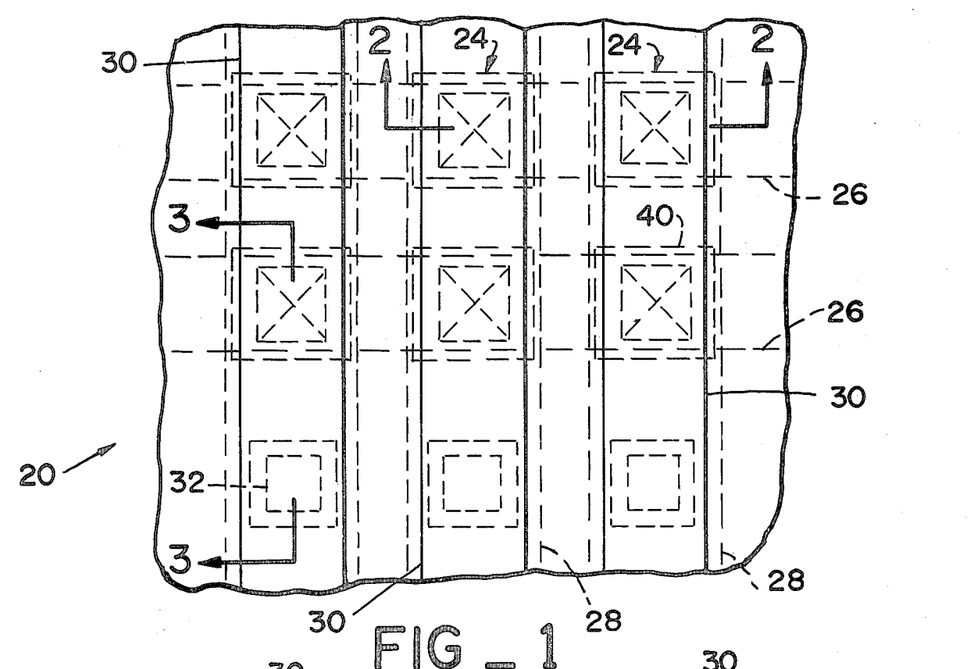
FIG. 1 is an enlarged fragmentary plan view of the core portion of a memory device constructed in accordance with the invention.
Figure 2:
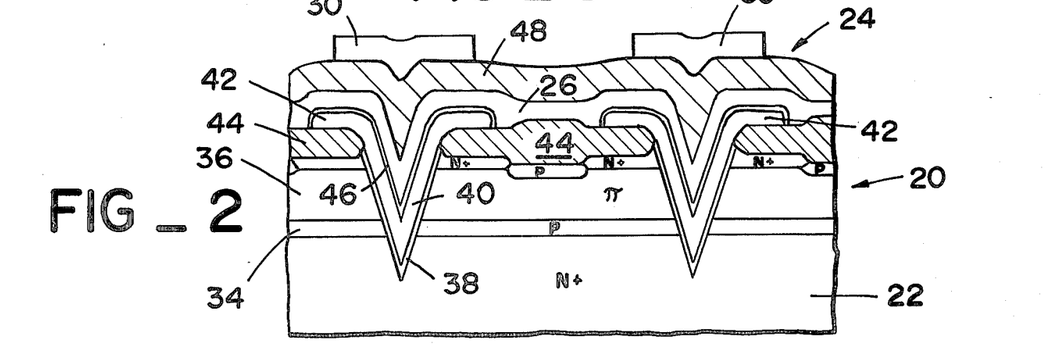
FIG. 2 is a further enlarged view in cross section taken at line 2—2 of FIG. 1 and showing the internal construction of the memory core portion of the device.
Figure 3:
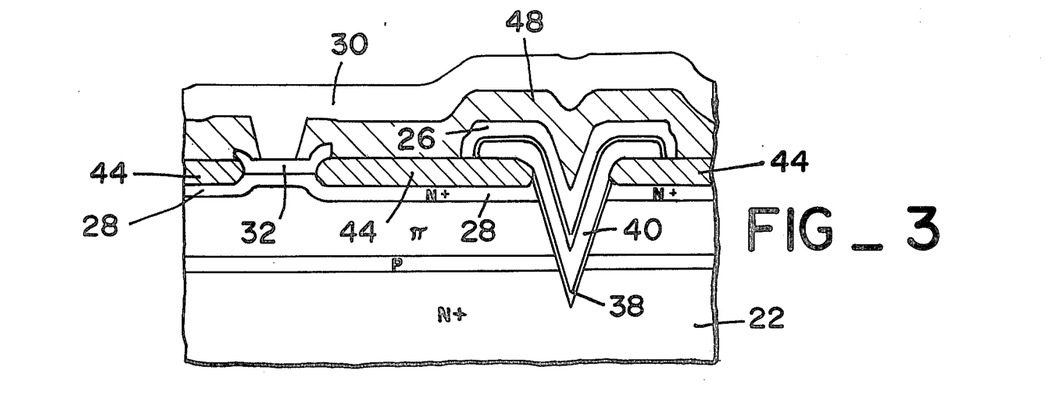
FIG. 3 is a view in cross section similar to FIG. 2 and taken at line 3—3 of FIG. 1.

With reference to the drawing, FIG. 1 shows a greatly enlarged portion of the memory core of a programmable-read-only-memory device (PROM) 20 according to the present invention, which is formed as an integrated circuit on a single chip or substrate 22 of semiconductor material. FIGS. 2 and 3 are cross sectional views of this core portion and show greater detail of the device structure. Only a limited number of memory cells 24 are illustrated in FIG. 1, but a typical PROM device may have many such cells arranged in an array on the chip at equally spaced apart intervals in addition to peripheral circuitry for encoding and decoding, etc. Each of the memory cells of the core is located within an area on the chip that is defined by the crossover area of a word line 26 and a bit line 28. The word lines 26 are conductive paths formed at parallel, spaced apart intervals near the surface of the device and the bit lines 28 are elongated conductive regions that are oriented perpendicular to the word lines and are buried within the device. To provide better access to the buried bit lines for peripheral circuitry, surface bit lines 30 may be supplied which are connected at preselected locations by vertical conductive contacts 32. The actual width of all bit lines and word lines and the spacing between them may be readily selected in accordance with engineering design rules familiar to those skilled in the art. For example, the width of both bit and word lines may be around 8 microns or less, and the spacing between their centerlines may be around 14 microns or less, so that a relatively dense array of cells can be achieved in the memory core.

A pair of typical programmable memory cells 24 formed at the cross-over areas of a word and bit line in accordance with the present invention is shown in greater detail in the sectional view of FIG. 2. In the embodiment shown the substrate 22 is doubly-doped silicon material having a thickness of around 15 mils that has been doped with both P and N type dopants. For example, it may be N-doped with antimony in the range of $2 \times 10^{18}$ to $1 \times 10^{19}$ atoms per cubic cm, while also being counter doped with a P-type dopant such as boron in the range of $3 \times 10^{16}$ to $1 \times 10^{17}$ atoms per cubic cm. As an alternative starting material, an n-doped wafer may be predeposited or ion implanted with p-type dopant such as boron and heated at a suitable temperature to provide the same level of P-type counter doping at the front surface as the doubly-doped silicon material. Extending across the substrate is a thin layer 34 of P conductivity material that forms the interfacing layer between the substrate 22 and the bottom surface of a thicker space charge layer or drift region 36. Diffused within the latter region are spaced apart buried bit lines 28 which are comprised of material having an N+ conductivity. Extending through each bit line 28, the P layer 34 and into the substrate 22 at spaced apart intervals along each bit line, is a thin layer 38 of silicon dioxide which forms a gate oxide having a "V" shape in cross section. Actually, this latter thin layer is preferably V-shaped in two directions and therefore has an inverse square pyramidal shape. A floating gate 40 having the same V-shaped cross section is formed on the upper surface of the V-shaped thin layer and it may have upper peripheral portions 42 that flare outwardly and essentially parallel to the lower P layer 34. This floating gate is formed from some suitable conductive material such as polycrystalline silicon. The upper flared-out gate portions 42 extend outwardly on each side with sufficient overlap to guarantee complete coverage of the thin insulating layer 38, and they are spaced above the buried bit line by an insulating layer 44 of silicon dioxide that is considerably thicker than the gate oxide layer 38. A thin insulating oxide layer 46 also extends over the floating gate 40 and conforms to its general shape. Thus, the gate 40 is surrounded by the thin layers 38 and 46.

As shown in FIG. 2, a word line 26 of conductive material such as poly crystalline silicon and having a uniform width extends over the thick oxide layer 44 and the thin oxide layer 46 covering each floating gate of each memory cell. A layer 48 of insulation material such as silicon dioxide formed by a chemical vapor deposition process (vapox) covers the spaced apart word lines. As shown in FIG. 3, the surface bit lines 30 are provided at spaced apart intervals directly about the buried N+ diffused bit lines 28. At preselected intervals a vertical conductive contact 32 is provided which interconnects a surface bit line with its buried bit line. Such contacts are formed where necessary for good electrical continuity at preselected locations between memory cells in a typical device.

Figure 4:
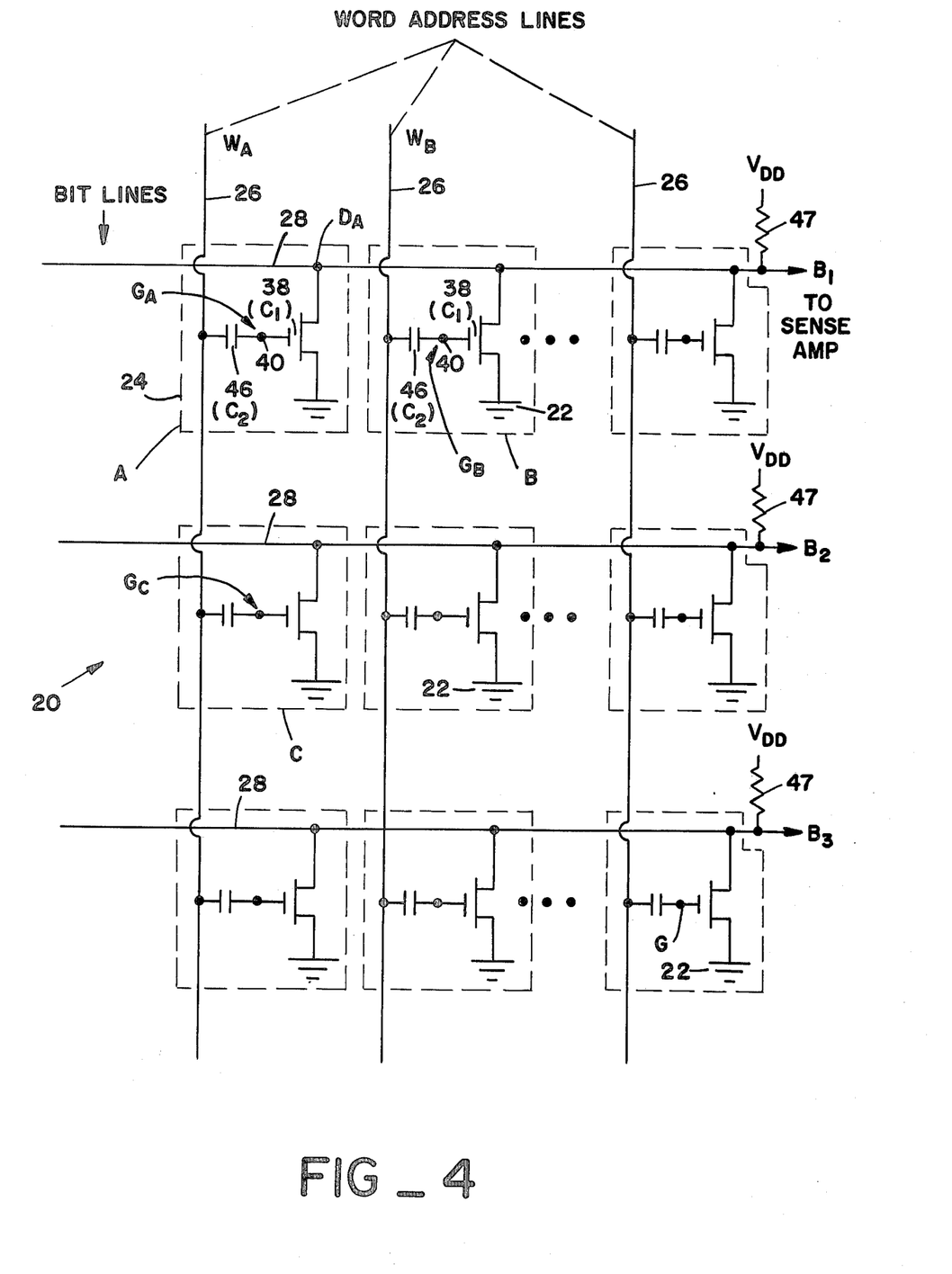
FIG. 4 is a schematic circuit diagram for the memory device shown in FIG. 1.

The operation of a programmable read only memory device 20 having a multiplicity of such single transistor cells 24 each utilizing a floating gate 40 as described, may be readily understood with reference to FIG. 4. In the device 20, the substrate 22 serves as a common source or ground plane and the N+ diffused or buried bit lines 28 form the drain of a V-type MOS transistor at each memory cell 24 in combination with its "V" pyramidal shaped floating gate 40 which extends over the thin gate oxide layer 38 (having a capacitance $C_1$) into the substrate source. The floating gate serves to store a program charge and the conductive word line 26 couples through the capacitance ($C_2$) of the upper thin oxide layer 46. The bit lines are connected to suitable sense-amplifiers in the usual manner and to a fixed voltage potential ($V_{DD}$) through suitable biasing networks represented by resistors 47. Data is written into a cell when a potential (e.g. 24 volts) is applied to a selected word line 26 while an associated bit line is biased to a lower potential (e.g. 20 volts). When this occurs, the hot electrons are injected into the gate oxide near the drain junction of a cell 24 and are attracted to the cell's floating gate 40 which has been charged positive by capacitance coupling from the word line. The electrons must be sufficiently energetic to overcome the potential barrier of the gate oxide 38. Without a selection of the word line, i.e. when the word line remains at zero potential the floating gate of the cell remains near zero potential and therefore will not attract the charges. After injecting the negative charge on the floating gate, the word line is returned to near zero potential and the floating gate returns to some negative potential, depending on the quantity of electrons that it has collected. The values of capacitor sizes ($C_1$ and $C_2$) and potentials in a programmable memory device embodying the invention may vary according to well known electrical and semiconductor principles. For example, if it is assumed that $C_2 = 2C_1$, the 24 volt potential applied to a word line will couple 16 volts into a floating gate, which is sufficient to attract the programming charge generated by the avalanching bit line. In this example the bit line is assumed to create impact ionization at a potential of 20 volts. A net voltage shift of 6 volts is assumed on the floating gate. During the read cycle, an operation around 5 volts is assumed, e.g. the word line induces a 3 volt shift on the floating gate. If the gate was charged more negative than a value of $-3$ volts, the transistor remains nonconductive and the output remains at $V_{DD}$. If the floating gate was not charged negative, the floating gate is coupled to $+3$ volts which is sufficient to turn-on the transistor (Threshold Voltage ($V_T$) = 1 volt is assumed) and the output is near ground.

In FIG. 4, the effects of an activated or programmed cell is designated as A, and neighbor cells are designated as B and C. If it is assumed that (1) $C_2 = 2C_1$; (2) $V_{DD}$ is 5 volts; and (3) hot electron injection occurs at the VMOS drain when $V_G = 15$ volts and $V_D = 20$ volts, the effects on these various cells would be substantially as follows during write and read operations:

| OPERATION | $V_{WA}$ | $V_{WB}$ | $V_{B1}$ | $V_{B2}$ | $V_{GA}$ | $V_{GB}$ | $V_{GC}$ |
|---|---|---|---|---|---|---|---|
| WRITE 1 in cell A | | | | | | | |
| INITIAL | 0 | 0 | 0 | 0 | 0 | 0 | 0 |
| WORD SELECT | 24 | 0 | 0 | 0 | 16 | 0 | 16 |
| WRITE "1" | 24 | 0 | 20 | 0 | 10 | 0 | 16 |
| STAND-BY | 0 | 0 | 0 | 0 | $-6$ | 0 | 0 |
| READ cell A and cell C | | | | | | | |
| STAND-BY | 0 | 0 | $V_{DD}$ | $V_{DD}$ | $-6$ | 0 | 0 |
| WORD SELECT | 4.5 | 0 | $V_{DD}$ | $V_{low}$ | $-3$ | 0 | $+3$ |
| STAND-BY | 0 | 0 | $V_{DD}$ | $V_{DD}$ | $-6$ | 0 | 0 |

As indicated by the above chart in the "Initial" state, all cells are at a "zero" level, that is the floating gate inner voltage for each cell designated as the node "G", is zero volts, with no potential applied to the floating gate surface. To change any cell from its initial "zero" state to a "one" level, the writing or "Word Select" operation is accomplished by applying a first voltage (e.g. 24 volts) to the word address line ($W_A$) and a second voltage (e.g. 20 volts) to a bit line 28. With $C_2 = 2C_1$, as previously stated, the 24 volts on the word line couples 16 volts into a floating gate at the node $G_A$. Now, the "Write 1" operation occurs when the drain of the cell transistor at node $D_A$ is raised to 20 volts thereby causing an electron transfer from the drain to the floating gate node $G_A$ and all causing this node $G_A$ to decrease from 16 to 10 volts. When this programmed cell is returned to "Stand-By", it reverts to its initial state as with no potential, but with the floating gate at a level of $-6$ volts. Thus, the difference between a programmed device and a non-programmed device is that due to the hot electron injection from the VMOS transistor drain to the floating gate 40, the floating gate potential can be made to be minus six volts.

During a reading operation a programmed and a non-programmed device can be distinguished as those assigned as arbitrarily a "zero" type and those assigned arbitrarily as a "one" type bit of computer information and then by reading them in the following manner. Assume, as indicated in the above chart, that during a "Word Select" operation, a standard reading voltage of 4.5 volts is applied to the gate of a zero or unwritten device. Based on the assumed capacitance ratio ($C_2 = 2C_1$) the voltage at the inner floating node $G_C$ will be 3 volts. Since this is larger than the typical threshold voltage ($V_T$) of one volt for the VMOS transistor of the cell, the device will turn on. When this occurs, current will be drawn from an attached load resistor 47 connected to a bit line and the output of the cell goes to a voltage called $V_{low}$, typically 0.5 volt. The resistor 47 is selected so that its impedance ratio with a device in the state given produces the desired output voltage. When a programmed device is read, the reading voltage of 4.5 volts is again applied from the word line and the G node again rises by 3 volts. However, since in a programmed or written device the G node is initially at $-6$ volts, its final voltage is a minus 3 ($-3$) volts. Since this latter voltage is less than the threshold voltage of the VMOS transistor of the cell, the transistor does not turn on, draws no current and acts as though it were not even in the circuit. Thus, the output voltage from the cell is the same as the supply voltage $V_{DD}$, typically 5 volts which is evaluated by the sense amplifier as a "one" value.

PROCESS DESCRIPTION

Fabrication of the semiconductor memory device 20 in accordance with the invention may be accomplished by a series of method steps as described below. As will be apparent, the method is applicable for making a completely integrated device which includes the V-type memory cells, contacts between surface and buried bit lines.

The following method steps are more specifically described in conjunction with the accompanying figures which illustrate how a memory cell with its floating gate and an adjacent contact can be formed simultaneously.

Figure 5:
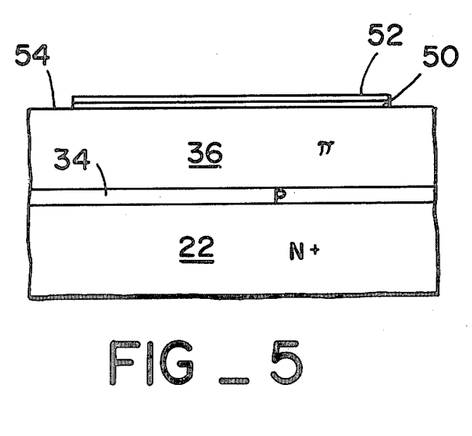
FIGS. 5-14 are a series of views in cross section showing the method steps for making the device of FIGS. 1-3.

As shown in FIG. 5, the method commences by first providing the silicon wafer 22 of >100< crystal orientation which has been doped with an N-type dopant such as antimony or arsenic. The wafer is then exposed to a P-type dopant such as boron in an ion implant machine or a predeposition type diffusion until a thin layer 34 at the surface of the silicon wafer is doped with the P-type dopant. This layer is typically 0.01 to 1.0 microns thick. The wafer is then placed in a high temperature diffusion tube whose temperature is in the range of 900° C. to 1,200° C. and the P-type dopant is diffused further into the silicon to a depth of 3 to 30 microns. The predeposition and diffusion cycles are tailored to produce a surface concentration of P-type dopant which is sufficient to create the desired threshold voltage on the active devices after all subsequent processing steps are finished.

After the P-type drive-in diffusion, the wafer is placed in an epitaxial silicon deposition system where the layer 36 of single crystal silicon typically 1.0 to 10.0 microns thick is grown on the wafer. This layer, designated by the symbol "Pi" in the drawing, is of the same crystal orientation as the starting material 22 and is preferably lightly doped with P-type dopant typically in the range of $5.0 \times 10^{14}$ to $5.0 \times 10^{15}$ atoms/cm$^3$. When the epitaxial layer doping is below $5 \times 10^{14}$, the device programming voltage is raised above practical levels. However, such a device is extremely fast in the read mode of operation. For epitaxial layer doping of $5 \times 10^{15}$ atoms/cc., the device programming voltage is lower and more practical. However, this higher doping in the epitaxial layer creates higher bit line 62-to-epitaxial layer 36 capacitance and therefore makes the device much slower in the read mode of operation. Thus, using the aforementioned range those skilled in the art can vary the epitaxial doping amount to achieve the desired performance characteristics in a memory device.

During the epitaxial silicon deposition process the P-type dopant in the substrate out-diffuses into the epitaxial layer to form the thin P layer 34. Actually, it is preferred that the N+ substrate 22 be heavily doped with antimony with some background P-doping with boron. Later, during heat treatments of the wafer, both the antimony and the boron out-diffuse into the Pi layer or region of the substrate. However, since the diffusion coefficient of boron is about ten times the diffusion coefficient of antimony for any temperature in silicon, the boron diffuses out farther during the same time and temperature treatment than does the antimony. This differential diffusion characteristics is important to the present invention because it provides the VMOST transistor with the typically incompatible combination of short channel length and relatively high (25 volt) breakdown voltage.

After epitaxial deposition, the wafer is placed in an oxidizing atmosphere at a suitable temperature (e.g. around 1,000° C.) until the surface of the silicon wafer has oxidized to form an oxide layer 50 with a thickness in the range of 100 Å to 5000 Å. A silicon nitride film 52 is then deposited on the wafer to a thickness of 200 Å to 3000 Å.

Figure 6:
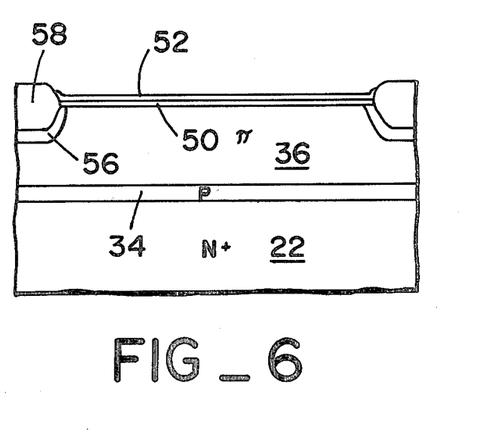

A layer of photoresist (not shown) is then applied to the upper surface of the wafer and a predetermined pattern of active areas of the wafer is defined in the photoresist. The nitride and oxide layers are then removed from the inactive areas 54 of the wafer not covered by the photoresist. The wafer is then exposed in the inactive areas to a P-type dopant such as boron by an ion implant machine or a predeposition type diffusion until a P-type layer 56 is formed at the surface. As shown in FIG. 6, this P-type layer is then diffused into the wafer in an oxidizing atmosphere below 1,250° C. which also grows a silicon dioxide or field oxide layer 58 above it which is several thousand angstroms thick (e.g. 5,000 Å–20,000 Å).

Figure 7:
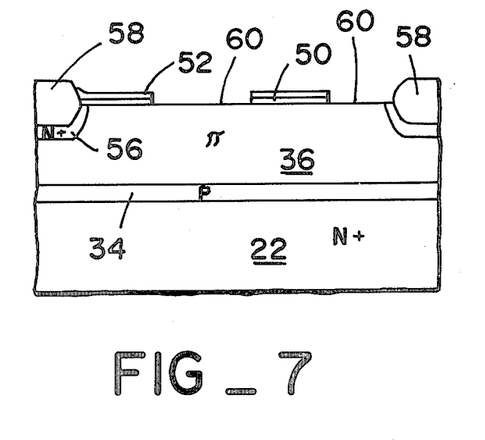
Figure 8:
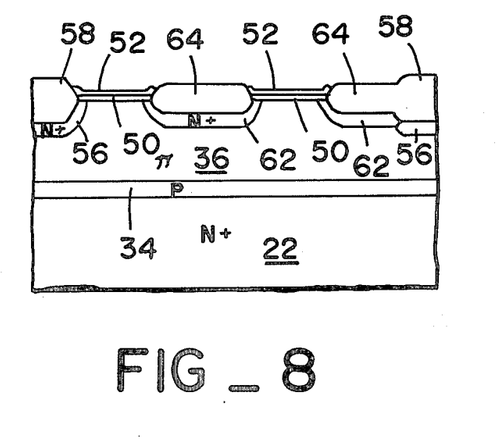

Now, as shown in FIG. 7, the wafer is coated with another photoresist layer (not shown) and a predetermined pattern for resistors, surface gates, conductive layer contact and V-groove cells is defined in the photoresist. The nitride layer 52 and its underlying oxide layer 50 are removed from the water surface to form open areas 60 adjacent to the areas for the elements just listed. In these latter open areas, as shown in FIG. 8, the wafer is now exposed to an n-type dopant 62 such as phosphorus or arsenic in a predeposition type diffusion at a temperature below 1,200° C. (for N+ source drain regions). The wafer is then placed in another oxidizing atmosphere at a temperature below 1,300° C. and a silicon dioxide layer 64 several thousand angstroms thick is grown over the regions 62 exposed during the n-type diffusion. The remaining nitride 52 on the wafer is then removed without etching the underlying oxide layer.

Figure 9:
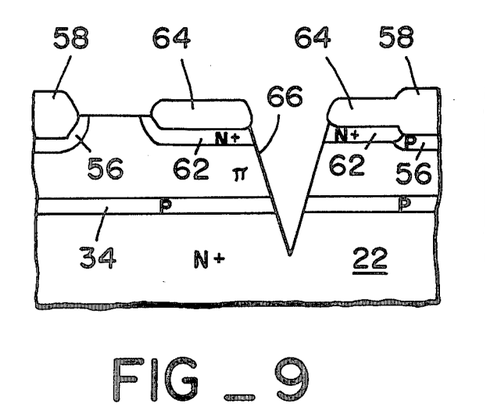
Figure 10:
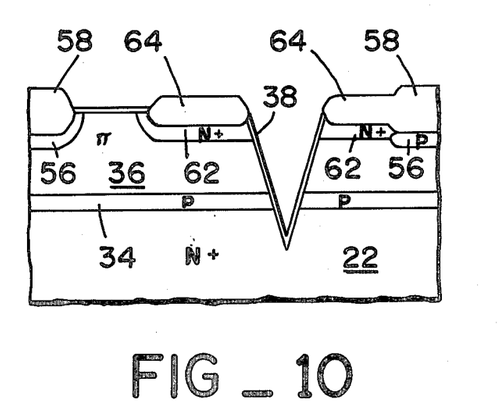

After the previous photo-resist layer has been removed, the wafer is then coated with another layer of photo-resist (not shown) and this photo-resist is patterned such that only those areas are exposed where V-groove recesses are desired for memory cells. An oxide etchant is then used to remove the thin oxide in these areas. Thereafter, as shown in FIG. 9, silicon is removed from these V-groove areas using an anisotropic etch which attacks silicon preferentially on different crystal planes. The amount of material removed is sufficient to create a V-shaped groove or recess 66 which penetrates through the epitaxial layer 36 grown at the beginning of the process and into the substrate material 22. After formation of the recesses V-grooves 66 the remaining nitride layer 52 and its underlying oxide layer 50 are removed in all areas including those where the contacts 32 are to be formed. After this, the wafer is placed in an oxidizing atmosphere at a suitable temperature and the silicon dioxide layer 38 is grown, as shown in FIG. 10, which forms the gate dielectric for all the VMOS memory cells.

Figure 11:
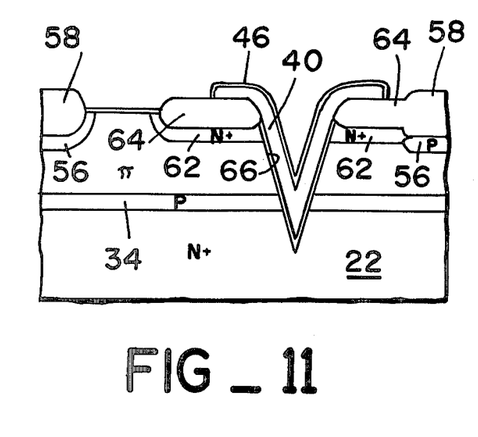

Now, referring to FIG. 11, a first polycrystalline silicon layer, typically less than 1 micron thick is deposited on the surface of the wafer and a photoresist masking and etching procedure is used to form the floating gates 40 within and over the V-shaped recesses 66 of the memory cells. Following this, the second thin oxide layer 46 is formed over the floating gates of the VMOS devices by placing the wafer in an oxidizing atmosphere at a temperature below 1,300° C. At this point another mask and etch procedure is used to remove the oxide layer in areas for the contacts 32.

Figure 12:
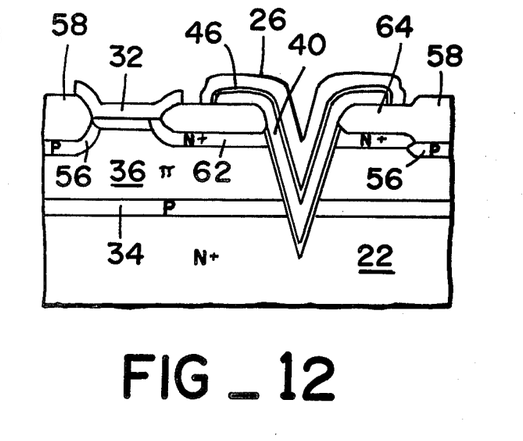

Now, as shown in FIG. 12, a second poly crystalline silicon layer 26 having approximately the same thickness as the floating gates is applied to the wafer. After depositing this second poly silicon layer, the wafer is exposed to an N-type dopant in a predeposition type diffusion operation. This operation is sufficiently long to dope the polysilicon so that it sheet resistance is less than 500Ω/□ (typically 50$\frac{5}{8}$/□), and to penetrate through the polysilicon into the epitaxial layer below areas 32.

A photoresist layer (not shown) is now applied and patterned so that it remains only over the areas where poly silicon is desired, and poly silicon is then removed from the exposed areas, to form the word lines 26 and the interconnecting contacts 32 for the bit lines.

Figures 13, 14:
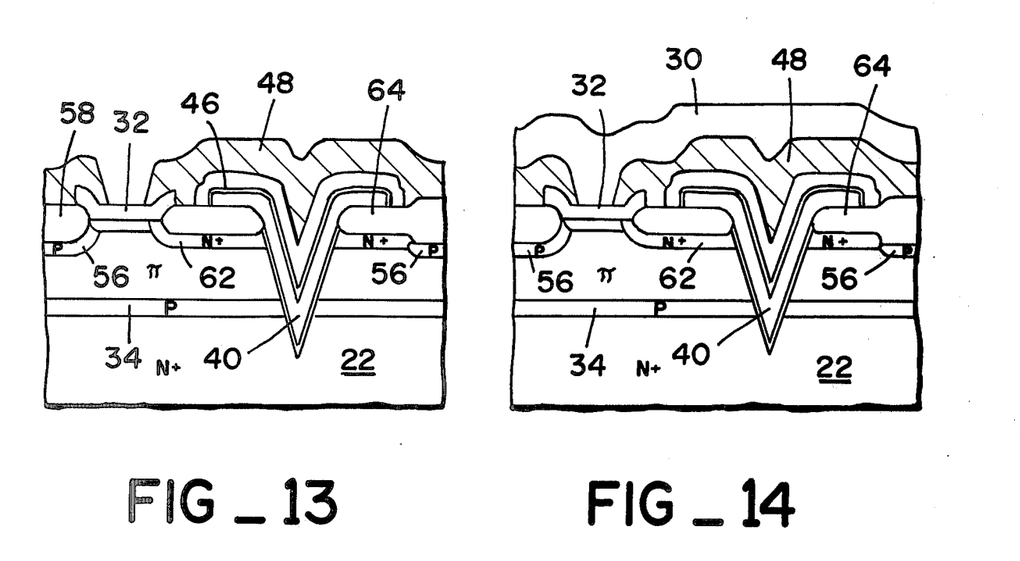

Silicon dioxide is then deposited on the surface of the wafer, as shown in FIG. 13, to form the insulating layer 48 to a thickness of several thousand angstroms. After this, photoresist is applied to the surface of the wafer again and is patterned to leave photo-resist everywhere except where contacts to the poly silicon or silicon are desired. The deposited oxide of the layer 48 is then removed from the exposed areas and the wafer is heated to a temperature below 1,300° C. which causes the deposited glass to flow and smooth the edges of the contacts. If an oxidizing atmosphere is used for this operation, the wafer is annealed in a neutral atmosphere at a temperature below 1,300° C. and recoated with photo-resist. The same contacts are again patterned in the photoresist and any oxide grown during the flow operation is removed from the contact areas.

As shown in FIG. 14, a metal such as aluminum or an aluminum-silicon alloy is then deposited on the surface of the wafer to a thickness of several thousand angstroms and the wafer is coated with photo-resist. This photo-resist layer is then patterned to leave photoresist wherever metallized areas are desired such as for the surface bit lines 30, and the exposed metal is removed. After the wafer is annealed in a neutral or reducing atmosphere at a temperature below 600° C., it is then complete unless a passivation and/or scratch protection layer of deposited silicon oxide or silicon nitride is desired.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A semiconductor programmable read only memory device comprising:
   a semiconductor substrate having a preselected conductivity;
   a layer of semiconductor material having the opposite conductivity from and extending across said substrate;
   a series of elongated, spaced apart, diffused regions in said layer of semiconductor material having the same conductivity as said substrate and forming buried bit lines;
   a layer of insulating material on said diffused bit line regions and said layer of semiconductor material;
   a series of elongated, spaced apart conductive regions forming word lines on said layer of insulating material and oriented transversely to said bit lines;
   a series of recesses spaced apart along each of said bit lines at locations where said word lines cross over said bit lines, each said recess extending through a said bit line and into said substrate and having a "V" shaped cross section;
   a floating gate of conductive material within each said recess and having a similar "V" shaped cross section, each said gate extending downwardly from a drain region formed by a said diffused bit line to a common source region formed by said substrate;
   a first thin dielectric layer between each said floating gate and covering the side walls of its said recess;
   a second thin dielectric layer between each said floating gate and a said word line directly above it; and
   surface bit lines of conductive material located on the surface of said device directly above said buried bit lines and connected thereto at preselected locations by contacts extending downwardly through said insulating layer.

2. The semiconductor memory device according to claim 1 wherein said semiconductor substrate is of >100< plane silicon material having an N+ type conductivity, said layer of semiconductor material on said substrate is an epitaxial layer of lightly doped P type conductivity material and said buried bit lines also have an N+ type conductivity.

* * * * *

UNITED STATES PATENT AND TRADEMARK OFFICE
CERTIFICATE OF CORRECTION

PATENT NO. : 4,222,062
DATED : September 9, 1980
INVENTOR(S) : James D. Trotter and Thurman J. Rodgers It is certified that error appears in the above—identified patent and that said Letters Patent is hereby corrected as shown below:

Column 1, line 19, cancel "programmable" and substitute --reprogrammable--;

Column 4, line 55, delete "about" and substitute --above--;

Column 6, line 65, cancel " >100< " and substitute --<100>--;

Column 8, line 60, cancel "it" and substitute --its--;

Column 8, line 61, cancel "5/8" and substitute -- $\Omega$ --;

Claim 2, line 35, cancel " >100< " and substitute --<100>--.

Signed and Sealed this

Tenth Day of February 1981

[SEAL]

Attest:

RENE D. TEGTMEYER

Attesting Officer

Acting Commissioner of Patents and Trademarks